US012652851B2

(12) United States Patent
    Xue et al.

(10) Patent No.:  US 12,652,851 B2
(45) Date of Patent:        Jun. 9, 2026

(54) SEMICONDUCTOR DEVICE AND MANUFACTURING PROCESS FOR THE SAME

(71) Applicant: WUHAN XINXIN SEMICONDUCTOR MANUFACTURING CO., LTD., Wuhan (CN)

(72) Inventors: Guangjie Xue, Wuhan (CN); Le Li, Wuhan (CN); Jun Zhou, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 473 days.

(21) Appl. No.: 18/145,032

(22) Filed: Dec. 22, 2022

(65) Prior Publication Data

US 2024/0128339 A1      Apr. 18, 2024

(30) Foreign Application Priority Data

Oct. 18, 2022    (CN) .......................... 202211275586.3

(51) Int. Cl.
    *H10D 64/23*        (2025.01)
    *H10D 30/63*        (2025.01)
    *H10D 64/01*        (2025.01)
(52) U.S. Cl.
    CPC ......... *H10D 64/258* (2025.01); *H10D 30/637* (2025.01); *H10D 64/01* (2025.01)
(58) Field of Classification Search
    CPC .... H10D 64/258; H10D 30/637; H10D 64/01; H10D 30/6729; H10D 30/6744;
    (Continued)

(56) References Cited

U.S. PATENT DOCUMENTS

2013/0049132 A1    2/2013  Doris et al.
2016/0268158 A1    9/2016  Leobandung

FOREIGN PATENT DOCUMENTS

CN        103715134 A      4/2014
CN        107424968 A      12/2017
            (Continued)

OTHER PUBLICATIONS

Chinese First Office Action, Chinese Application No. 202211275586. 3, mailed May 20, 2025 (16 pages).
                (Continued)

*Primary Examiner* — Shahed Ahmed

(57)                    ABSTRACT

The present disclosure provides a semiconductor device and a manufacturing method therefor. The method includes: providing a semiconductor structure, the semiconductor structure including a semiconductor substrate, a gate disposed on the semiconductor substrate, and an interlayer dielectric layer covering the semiconductor substrate and the gate; wherein the semiconductor structure further includes a first source/drain region and a second source/drain region; defining first connecting holes and at least one first air hole on the first source/drain region and/or the second source/drain region; wherein at least one first air hole is arranged between each adjacent two first connecting holes in an X direction and/or a Y direction, the X direction being a gate length direction, the X direction being perpendicular to the Y direction; sealing each first air hole to define a first cavity in the first air hole; and filling each first connecting hole with a conductive material.

20 Claims, 12 Drawing Sheets

(58) Field of Classification Search
CPC .. H10D 64/259; H10D 84/013; H10D 84/017;
H01L 21/76831; H01L 23/485; H01L
21/7682; H01L 2221/1042–1047
See application file for complete search history.

(56) References Cited

FOREIGN PATENT DOCUMENTS

| | | | | | |
|----|----------------|-----|---|---------|----------------|
| CN | 109712975 A    |     |   | 5/2019  |                |
| CN | 110098175 A    |     |   | 8/2019  |                |
| CN | 110729343 A    | *   |   | 1/2020  | ........... H01L 21/764 |
| CN | 113517196 A    |     |   | 10/2021 |                |
| CN | 114823894 A    |     |   | 7/2022  |                |
| WO | 2022061738 A1  |     |   | 3/2022  |                |

OTHER PUBLICATIONS

Chinese Second Office Action, Chinese Application No. 202211275586.
3, mailed Nov. 19, 2025 (19 pages).

* cited by examiner

1

1

SEMICONDUCTOR DEVICE AND MANUFACTURING PROCESS FOR THE SAME

CROSS REFERENCE

The present application claims priority of Chinese Patent Application No. 202211275586.3, filed on Oct. 18, 2022, the entire contents of which are hereby incorporated by reference in its entirety.

TECHNICAL FIELD

The present disclosure relates to the field of semiconductor manufacturing technologies, and in particular to a semiconductor device and a manufacturing process for the same.

BACKGROUND

Radio frequency (RF) technology is widely applied in various aspects of life, such as RF switches and other semiconductor devices. However, with the increasing frequency of semiconductor devices, the parasitic capacitance of semiconductor devices is large, especially the parasitic capacitance of the metal interconnect process can account for 30% of the total parasitic capacitance, resulting in a dramatic degradation of the RF performance of the semiconductor devices. In addition, the parasitic capacitance between the interconnecting through holes and the stray capacitance between the gate of the semiconductor device and the nearby interconnecting through holes are basically unavoidable.

SUMMARY OF THE DISCLOSURE

The present disclosure provides a semiconductor device and a manufacturing method therefor, to reduce the parasitic capacitance between two interconnecting holes.

To solve the above technical problem, a first aspect adopted by the present disclosure is to provide a manufacturing method for a semiconductor device, including: providing a semiconductor structure, the semiconductor structure including a semiconductor substrate, a gate disposed on the semiconductor substrate, and an interlayer dielectric layer covering the semiconductor substrate and the gate; wherein the semiconductor structure further includes a first source/drain region and a second source/drain region; defining a plurality of first connecting holes and at least one first air hole on the first source/drain region and/or the second source/drain region; wherein at least one of the at least one first air hole is arranged between each adjacent two of the plurality of first connecting holes in an X direction and/or a Y direction, the X direction being a gate length direction, the X direction being perpendicular to the Y direction; sealing each first air hole to define a first cavity in the first air hole; and filling each first connecting hole with a conductive material.

In some embodiments, the defining a plurality of first connecting holes and at least one first air hole on the first source/drain region and/or the second source/drain region includes: performing an etching process to simultaneously define the plurality of first connecting holes and the at least one first air hole on the first source/drain region and/or second source/drain region; wherein the first source/drain region and second source/drain region are adjacent to each other in the X direction; in the X direction, one of the first source/drain region and the second source/drain region is arranged with one of the plurality of first connecting holes, and the other one of the first source/drain region and second source/drain region is arranged with one of the at least one first air hole.

In some embodiments, the defining a plurality of first connecting holes and at least one first air hole on the first source/drain region and/or the second source/drain region includes: performing an etching process to simultaneously define the plurality of first connecting holes, a second connecting hole, and the at least one first air hole in a device region; wherein each first connecting hole runs through to the first source/drain region and/or the second source/drain region; the second connecting hole runs through to the gate; the conductive material is filled into each first connecting hole and the second connecting hole; each first air hole is disposed on the first source/drain region and/or the second source/drain region.

In some embodiments, the method further includes defining simultaneously a second air hole in the device region by performing the etching process; wherein the second air hole is disposed on the gate; wherein the sealing each first air hole to define a first cavity in the first air hole includes: simultaneously sealing the second air hole to define a second cavity.

In some embodiments, the number of the plurality of first connecting holes and the number of the at least one first air hole are each greater than one, and the plurality of first connecting holes and the at least one first air hole are alternated along the X direction and/or the Y direction.

In some embodiments, the sealing each first air hole to define a first cavity in the first air hole includes: depositing a dielectric layer on a surface of the semiconductor structure to cover a sidewall and a bottom wall of each first connecting hole and to seal the first air hole to define the first cavity.

In some embodiments, before the filling each first connecting hole with a conductive material, the method further includes: etching off at least the dielectric layer on the bottom wall of each first connecting hole to expose the first source/drain region and/or the second source/drain region, and remaining at least part of the dielectric layer in the air hole.

In some embodiments, the first air hole and/or the second air hole has a circular, square, oval or elongated cross-section.

To solve the above technical problem, a second aspect adopted by the present disclosure is to provide a semiconductor device, including: a semiconductor structure, including: a semiconductor substrate, a gate disposed on the semiconductor substrate, and an interlayer dielectric layer covering the semiconductor substrate and the gate; wherein the semiconductor structure further includes a first source/drain region and a second source/drain region; wherein a plurality of first connecting holes and at least one first air hole are defined on the first source/drain region and/or the second source/drain region; each first connecting hole is filled with a conductive material, and the conductive material is in contact with the first source/drain region and/or the second source/drain region; a first cavity is defined in each of the at least one first air hole; at least one of the at least one first air hole is arranged between each adjacent two of the plurality of first connecting holes in an X direction and/or a Y direction, the X direction being a gate length direction, the X direction being perpendicular to the Y direction.

In some embodiments, a second connecting hole is defined on the gate, the conductive material is further filled in the second connecting hole, and the conductive material is in contact with the gate.

In some embodiments, a second air hole is defined on the gate, and a second cavity is defined in the second air hole.

In some embodiments, the number of the plurality of first connecting holes and the number of the at least one first air hole are each greater than one, and the plurality of first connecting holes and the at least one first air hole are alternated along the X direction and/or the Y direction.

In some embodiments, a dielectric layer is arranged at an orifice of each first connecting hole to seal the first connecting hole and/or an orifice of the second connecting hole to seal the second connecting hole; the dielectric layer is silicon nitride and/or silicon oxynitride.

In some embodiments, the first air hole and/or the second air hole has a circular, square, oval or elongated cross-section.

Technical effect of present disclosure: compared to the related art, the present disclosure provides a semiconductor device and a manufacturing method therefor, by forming a first connecting hole and a first air hole in the first source/drain region and/or the second source/drain region of the semiconductor structure, and arranging at least one first connecting hole between two adjacent first air hole in the X direction and/or Y direction; the X direction is the gate length direction and perpendicular to the Y direction; sealing the first air hole to define a first cavity in the first air hole; thereafter, filling the first connecting hole with the conductive material. The method avoids the problem of the conductive material entering the first air hole and the second air hole. Further, since the dielectric constant of air is less than that of other substances, the first cavity structure defined by the at least one air hole may reduce the parasitic capacitance between the two adjacent first connecting holes and reduce the parasitic capacitance between the semiconductor substrate and other metal layers in the semiconductor structure, thereby effectively reducing the effect of the parasitic capacitance of the manufactured semiconductor device on its RF performance. In addition, the first air hole may be formed at the same time as the first connecting hole, eliminating the need to set up a processing process specifically for the first air hole. Compared with the solution of preparing the first air hole by a special process, the whole manufacturing process of the semiconductor device is simpler.

BRIEF DESCRIPTION OF THE DRAWINGS

In order to more clearly illustrate the technical solutions in the embodiments of the present disclosure, the following is a brief description of the drawings required for the description of the embodiments, and it will be obvious that the drawings in the following description are only some embodiments of the present disclosure, and that other drawings can be obtained from these drawings without creative work for those skilled in the art.

REFERENCE NUMERALS

Figure 1:
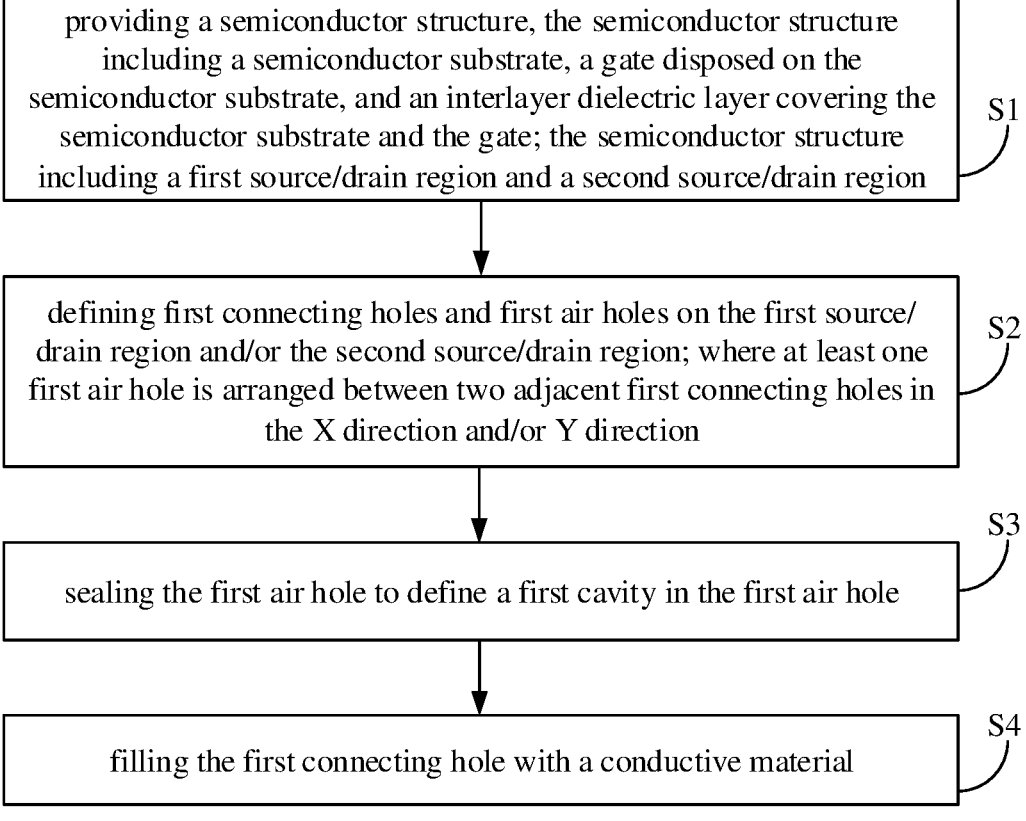
FIG. 1 is a flowchart of a manufacturing method for a semiconductor device according to an embodiment of the present disclosure.

Semiconductor structure 1; bottom semiconductor layer 11a; buried oxide layer 11b; top semiconductor layer 11c;

first source/drain region 111; second source/drain region 112; gate 12; sidewall 13; interlayer dielectric layer 14; isolation structure 15; etch stop layer 16; first connecting hole 17a; second connecting hole 20; first air hole 17b; second air hole 17c; amorphous carbon layer 18a; first anti-reflective layer 18b; second anti-reflective layer 18c; photoresist layer 18d; dielectric layer 19; conductive material 21.

DETAILED DESCRIPTION

The technical solutions in embodiments of the present disclosure will be clearly and completely described below in conjunction with the accompanying drawings in the embodiments of the present disclosure, and it is obvious that the described embodiments are only a part of the embodiments of the present disclosure, but not all of them. Based on the embodiments in the present disclosure, all other embodiments obtained by those skilled in the art without creative labor fall within the scope of the present disclosure.

The terms "first", "second", and "third" in the present disclosure are intended for descriptive purposes only and are not to be construed as indicating or implying relative importance or implicitly indicating the number of indicated technical features. Therefore, a feature defined with "first", "second", or "third" may explicitly or implicitly include at least one such feature. In the description of the present disclosure, "multiple" means at least two, e.g., two, three, etc., unless otherwise expressly and specifically limited. All directional indications (e.g., up, down, left, right, forward, backward . . . ) in the present disclosure are intended only to explain the relative position relationship, movement, etc., between components in a particular posture (as shown in the accompanying drawings), and if that particular posture is changed, the directional indications are changed accordingly. In addition, the terms "include" and "have", and any variations thereof are intended to cover non-exclusive inclusion. For example, a process, method, system, product, or apparatus including a series of steps or units is not limited to the listed steps or units, but optionally further includes steps or units not listed, or optionally further includes other steps or units inherent to the process, method, product, or apparatus.

References herein to "embodiment" mean that particular features, structures, or characteristics described in connection with an embodiment may be included in at least one embodiment of the present disclosure. The presence of the phrase at various positions in the specification does not necessarily mean the same embodiment, nor is it a separate or alternative embodiment that is mutually exclusive with other embodiments. It is understood, both explicitly and implicitly, by those skilled in the art that the embodiments described herein may be combined with other embodiments.

The present disclosure is described in detail below in conjunction with the accompanying drawings and embodiments.

Referring to FIG. 1, FIG. 1 is a flowchart of a manufacturing method for a semiconductor device according to an embodiment of the present disclosure. In the embodiments, the semiconductor device may be a radio frequency (RF) device, such as an RF switch, an RF power amplifier, etc. The manufacturing method for the semiconductor device of the present disclosure may reduce the parasitic capacitance between interconnecting through holes and between the semiconductor substrate and other metal layers, and weaken the effect of the parasitic capacitance of the resulting semiconductor device on its RF performance. The manufacturing method specifically includes the steps at blocks illustrated in FIG. 1.

At step S1: providing a semiconductor structure, the semiconductor structure including a semiconductor substrate, a gate disposed on the semiconductor substrate, and an interlayer dielectric layer covering the semiconductor substrate and the gate; the semiconductor structure including a first source/drain region and a second source/drain region.

Figure 2:
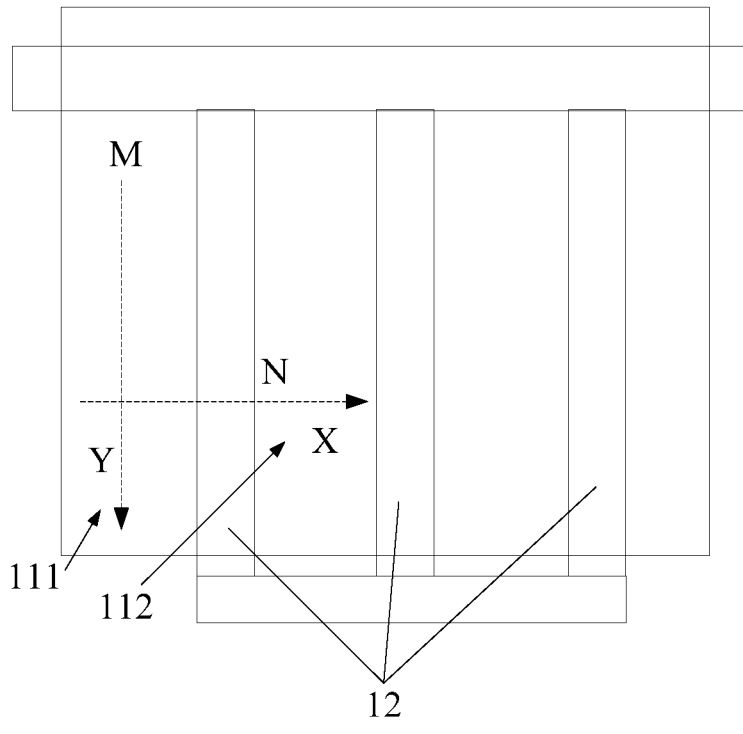
FIG. 2 is a top schematic view of a semiconductor structure according to an embodiment of the present disclosure.
Figure 3:
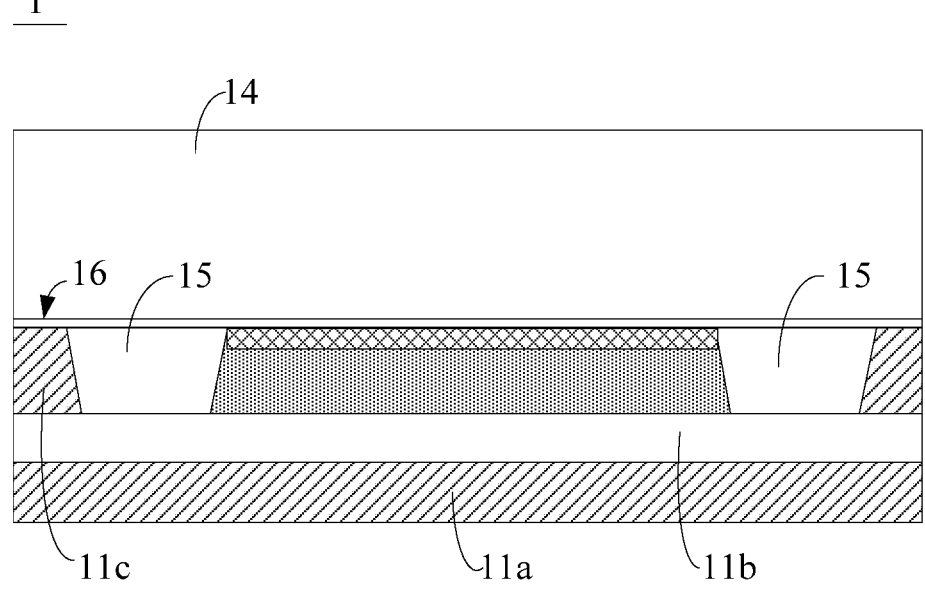
FIG. 3 is a Y-directional cross-sectional schematic view at position M of the semiconductor structure shown in FIG. 2.
Figure 4:
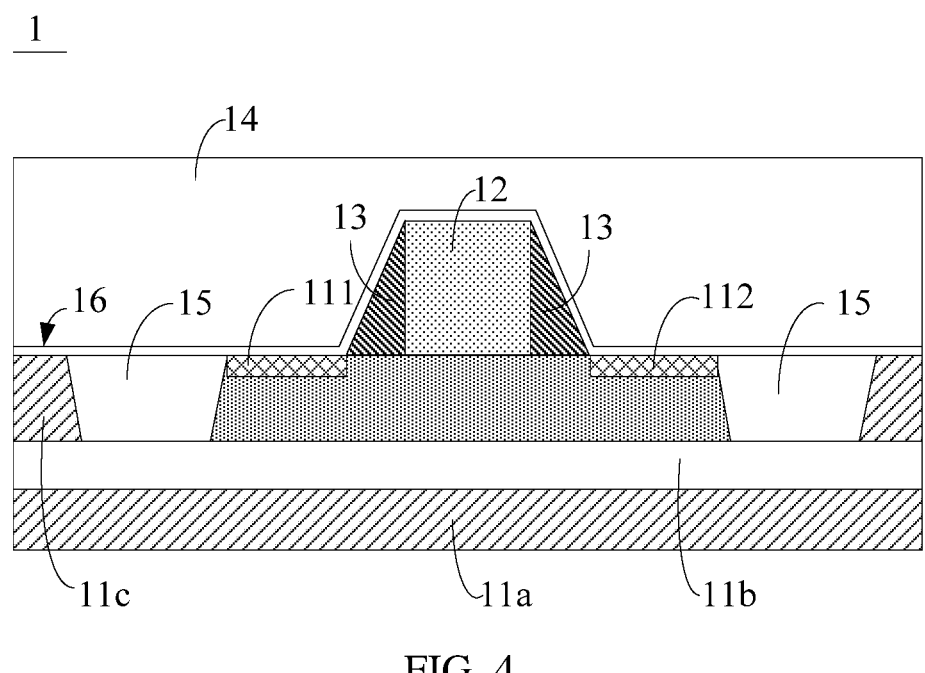
FIG. 4 is an X-directional cross-sectional schematic view at position N of the semiconductor structure shown in FIG. 2.

Referring to FIGS. 2 to 4, FIG. 2 is a top schematic view of a semiconductor structure according to an embodiment of the present disclosure, FIG. 3 is a Y-directional cross-sectional schematic view at position M of the semiconductor structure shown in FIG. 2, and FIG. 4 is an X-directional cross-sectional schematic view at position N of the semiconductor structure shown in FIG. 2. The X direction is a gate length direction, and the Y-direction is a direction perpendicular to the gate length direction on the same source/drain region 111/112. The semiconductor structure 1 includes a semiconductor substrate, a gate 12 disposed on the semiconductor substrate, a sidewall 13, and an interlayer dielectric layer 14 covering the semiconductor substrate, the gate 12, and the sidewall 13. The semiconductor structure 1 includes a first source/drain region 111 and a second source/drain region 112.

The semiconductor substrate may be a silicon substrate, a germanium substrate, a semiconductor on insulator (SOI) substrate, etc. In the following embodiments, the RF device formed on the SOI substrate is taken as an example, and the semiconductor substrate includes a bottom semiconductor layer 11a, a buried oxide layer 11b, and a top semiconductor layer 11c, which are sequentially laminated. The gate 12, the sidewall 13, and the interlayer dielectric layer 14 are specifically arranged on a side of the top semiconductor layer 11c back from the buried oxide layer 11b.

The first source/drain region 111 and the second source/drain region 112 are specifically formed in the top semiconductor layer 11c. The first source/drain region 111 and the second source/drain region 112 may be in contact with the buried oxide layer 11b; or may not be in contact with the buried oxide layer 11b and be disposed above the buried oxide layer 11b, as shown in FIGS. 3-4. The first source/drain region and the second source/drain region may each be a raised source/drain region (RSD). Specifically, for example, the top semiconductor layer 11c and the bottom semiconductor layer 11a may be silicon, and the buried oxide layer 11b may be silicon oxide or silicon oxynitride. It should be noted that in the top semiconductor layer 11c, the first source/drain region 111, the second source/drain region 112, the third source/drain region, the fourth source/drain region, and so on are sequentially arranged in the X direction from left to right, and the present disclosure is illustrated by the first source/drain region 111 and the second source/drain region 112 as an example. For example, the first source/drain region 111 is a source region, and the second source/drain region 112 is a drain region; or the first source/drain region 111 is a drain region, and the second source/drain region 112 is a source region.

The gate 12 and the sidewalls 13 are arranged on a channel region of the top semiconductor layer 11c and are disposed on a side of the top semiconductor layer 11c back from the buried oxide layer 11b. The sidewalls 13 are disposed on both sides of the gate 12. The material of the interlayer dielectric layer 14 may specifically be silicon oxide.

In a specific implementation, a shallow trench isolation (STI) process may be adopted to form multiple isolation structures 15 in the top semiconductor layer 11c, to divide the top semiconductor layer 11c into multiple device regions, each device region corresponding to at least one first source/drain region 111 and at least one second source/drain region 112. The device region may correspond to a gate, a source region, and a drain region. The specific procedure of the STI process can be found in the prior art and will not be described herein.

Of course, in some embodiments, as shown in FIG. 4, the semiconductor structure 1 may further includes an etch stop layer 16, which is laminated on the side of the top semiconductor layer 11c back from the bottom semiconductor layer 11a and wraps around the gate 12 and sides of the sidewall 13 back from the top semiconductor layer 11c, thereby defining a etch stop position during the subsequent formation of the first connecting hole 17a and the first air hole 17b. The etch stop layer 16 may be silicon nitride or silicon oxynitride.

At step S2: defining first connecting holes and first air holes on the first source/drain region and/or the second source/drain region; where at least one first air hole is arranged between two adjacent first connecting holes in the X direction and/or Y direction.

Figure 5:
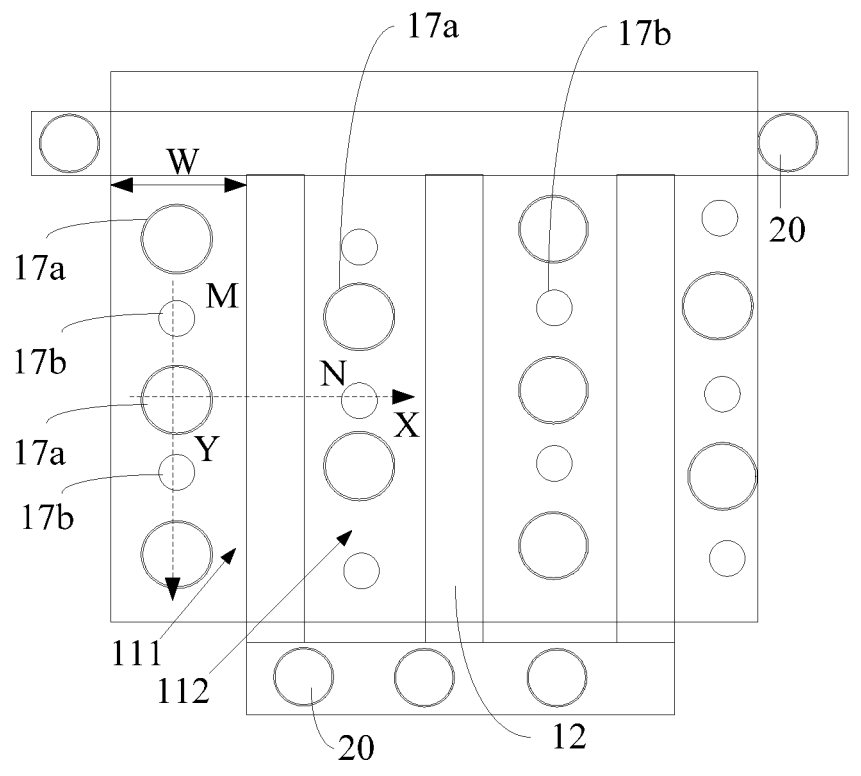
FIG. 5 is a structural schematic view of a first connecting hole and a first air hole defined on the semiconductor structure shown in FIG. 2 according to an embodiment of the present disclosure.
Figure 6:
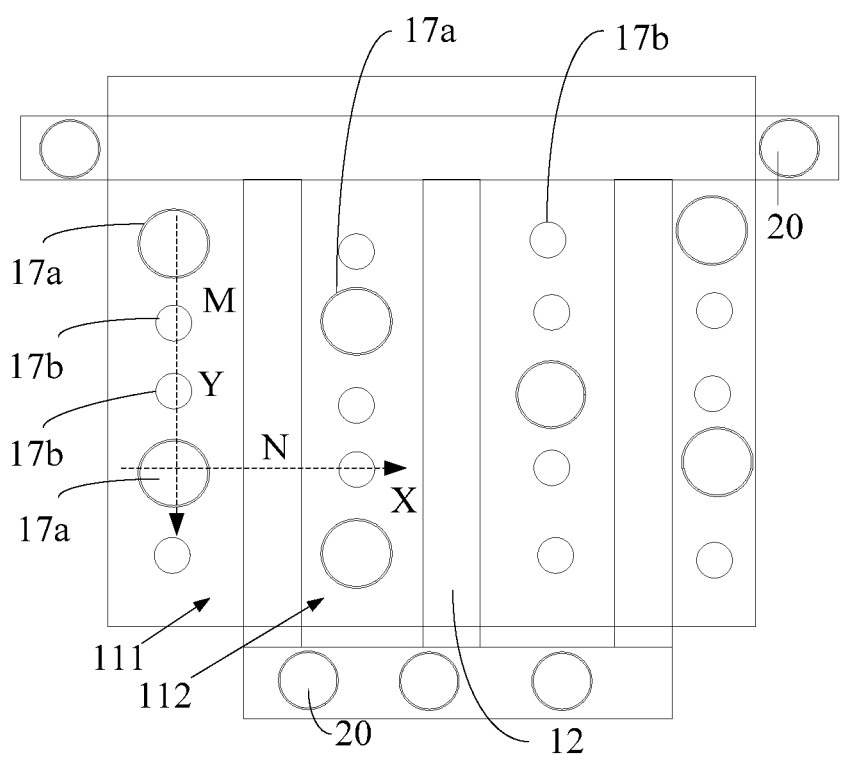
FIG. 6 is a structural schematic view of a first connecting hole and a first air hole defined on the semiconductor structure shown in FIG. 2 according to another embodiment of the present disclosure.
Figure 7:
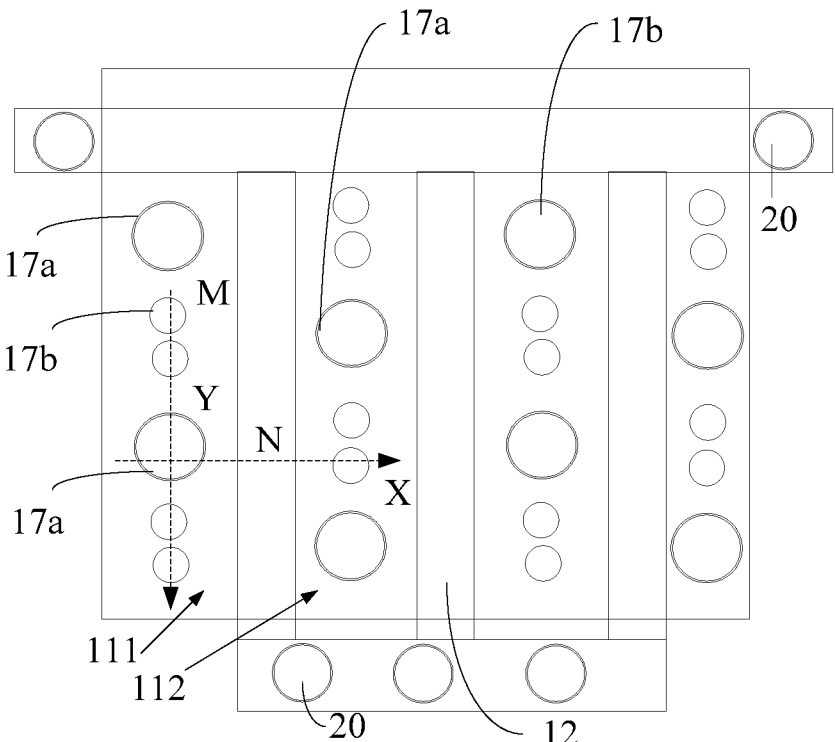
FIG. 7 is a structural schematic view of a first connecting hole and a first air hole defined on the semiconductor structure shown in FIG. 2 according to further another embodiment of the present disclosure.
Figure 8A:
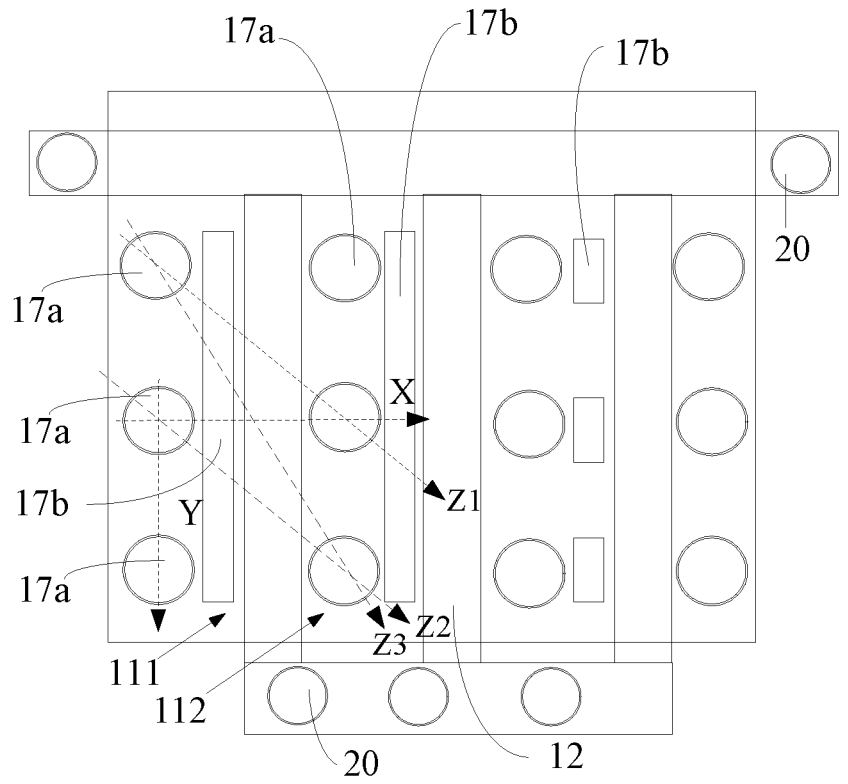
FIG. 8a is a structural schematic view of a first connecting hole and a first air hole defined on the semiconductor structure shown in FIG. 2 according to further another embodiment of the present disclosure.
Figure 8B:
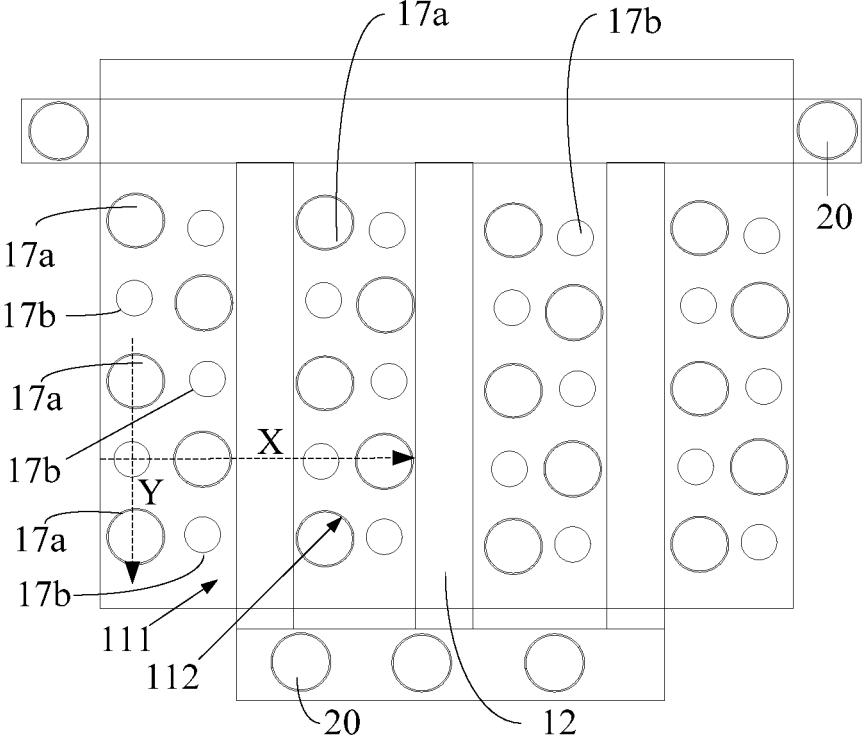
FIG. 8b is a structural schematic view of a first connecting hole and a first air hole defined on the semiconductor structure shown in FIG. 2 according to further another embodiment of the present disclosure.

Referring to FIGS. 5-FIG. 8b, FIG. 5 is a structural schematic view of a first connecting hole and a first air hole defined on the semiconductor structure shown in FIG. 2 according to an embodiment of the present disclosure; FIG. 6 is a structural schematic view of a first connecting hole and a first air hole defined on the semiconductor structure shown in FIG. 2 according to another embodiment of the present disclosure; FIG. 7 is a structural schematic view of a first connecting hole and a first air hole defined on the semiconductor structure shown in FIG. 2 according to further another embodiment of the present disclosure; FIG. 8a is a structural schematic view of a first connecting hole and a first air hole defined on the semiconductor structure shown in FIG. 2 according to further another embodiment of the present disclosure; and FIG. 8b is a structural schematic view of a first connecting hole and a first air hole defined on the semiconductor structure shown in FIG. 2 according to further another embodiment of the present disclosure.

Specifically, the semiconductor structure 1 may be etched to form the first connecting holes 17a and the first air holes 17b simultaneously in the first source/drain region 111 and/or the second source/drain region 11. At least one first air hole 17b is arranged between two adjacent first connecting holes 17a. Therefore, the cavity structure formed by the first air hole 17b may reduce the parasitic capacitance between the two adjacent first connecting holes 17a, thereby effectively reducing the effect of the parasitic capacitance of the resulting semiconductor device on its RF performance.

In some embodiments, as shown in FIG. 5 or FIG. 6, to reduce the parasitic capacitance between two adjacent first connecting holes 17a without increasing the width W of each source/drain region 111/112, the area of each source/drain region 111/112 may be controlled. In the X direction, one first connecting hole 17a or one first air hole 17b may be arranged in each source/drain region 111/112.

Specifically, as shown in FIG. 5, one first air hole 17b may be arranged between two adjacent first connecting holes 17a in the X direction and/or Y direction to prevent short circuit problems between two adjacent first connecting holes 17a while reducing parasitic capacitance. Alternatively, as shown in FIGS. 6 and 7, two first air holes 17b may be arranged between two adjacent first connecting holes 17a in the X direction and/or Y direction to minimize the parasitic capacitance while ensuring that no short-circuit problem occurs between two adjacent first connecting holes 17a.

Of course, as shown in FIG. 8a and FIG. 8b, in the X direction, one first connecting hole 17a and one first air hole 17b may be arranged in each source/drain region 111/112. In the embodiments, as shown in FIG. 8a, along the Y direction, one first air hole 17b may be arranged in a source/drain region 111/112, which has an elongated top view and extends along the Y direction; and each first connecting hole 17a arranged in the Y direction on the source/drain region 111/112 has a positive projection along the X direction falling at least partially on the first air hole 17b. In this way, it is possible to reduce the parasitic capacitance not only between two adjacent first connecting holes 17a along the X direction, but also between two adjacent first connecting holes 17a along a Z direction by virtue of the first air hole 17b. The Z direction is the direction of a line connecting centers of any two first connecting holes 17a in the two adjacent source/drain regions 111/112, for example, the Z1 direction, the Z2 direction, or the Z3 direction. The Z direction is set at a predetermined angle inclined to the X direction; the predetermined angle is greater than 0° and less than 90°.

Of course, as shown in FIG. 8a, along the Y direction, multiple first air holes 17b may be arranged on a source/drain region 111/112, and the multiple first air holes 17b are arranged in one-to-one correspondence with the multiple first connecting holes 17a arranged along the Y direction in the source/drain region 111/112. It can be understood that in the embodiments, one first air hole 17b may reduce the parasitic capacitance between two corresponding first connecting holes 17a adjacent to each other along the X-direction. Specifically, this first air hole 17b may be elongated or circular in shape.

Of course, it may also be understood by those skilled in the art that, as shown in the first source/drain region 111 and second source/drain region 112 in FIG. 8a, for the source/drain regions 111/112 on the semiconductor structure 1, each source/drain region 111/112 is arranged with a first air hole 17b along the Y direction. And/or, as shown in the third source/drain region in FIG. 8a, for the source/drain regions 111/112 on the semiconductor structure 1, each source/drain region 111/112 is arranged with multiple first air holes 17b along the Y direction. Alternatively, for the source/drain regions 111/112 on the semiconductor structure 1, some of the source/drain regions 111/112 are each arranged with one first air hole 17b along the Y direction, and the remaining parts of the source/drain regions 111/112 are each arranged with multiple first air holes 17b along the Y direction. The present disclosure makes no limitation thereto.

Figure 9:
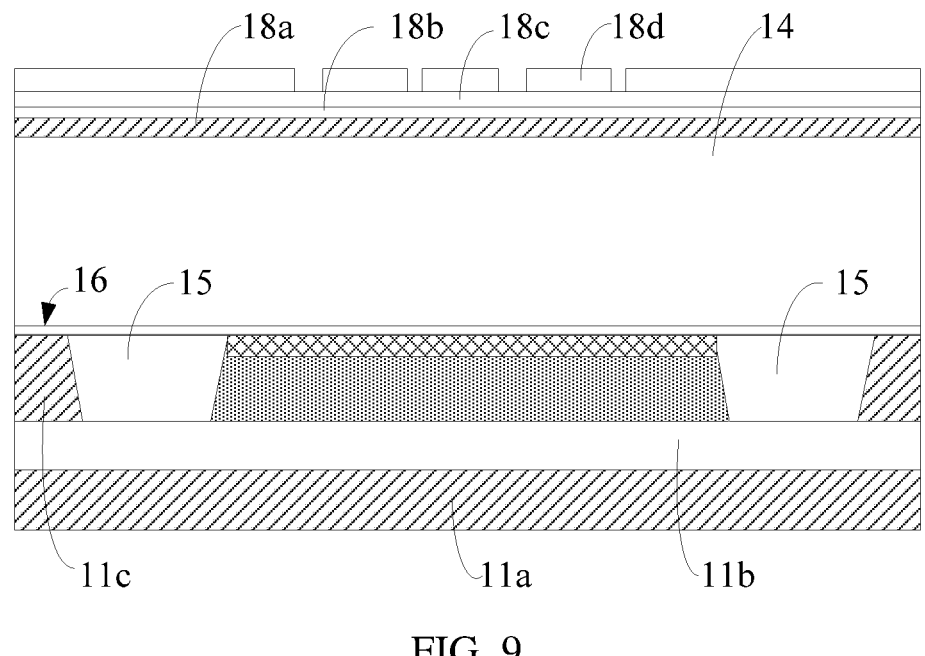
FIG. 9 is a structural schematic view of a semiconductor structure formed with a first photoresist mask in a first perspective according to an embodiment of the present disclosure.
Figure 10:
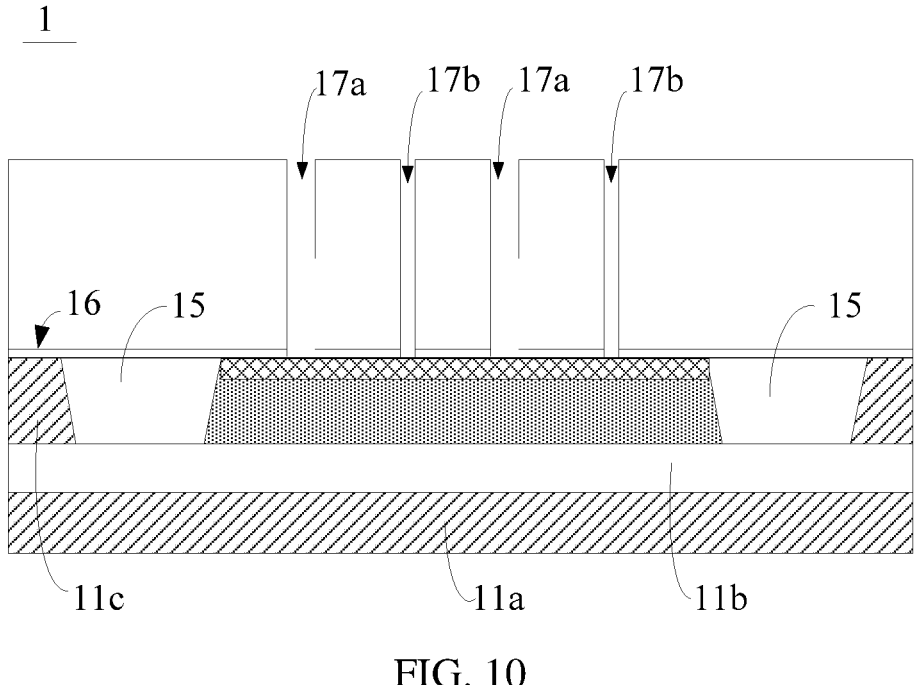
FIG. 10 is a structural schematic view of a first connecting hole and a first air hole defined on the semiconductor structure shown in FIG. 9.
Figures 11, 12:
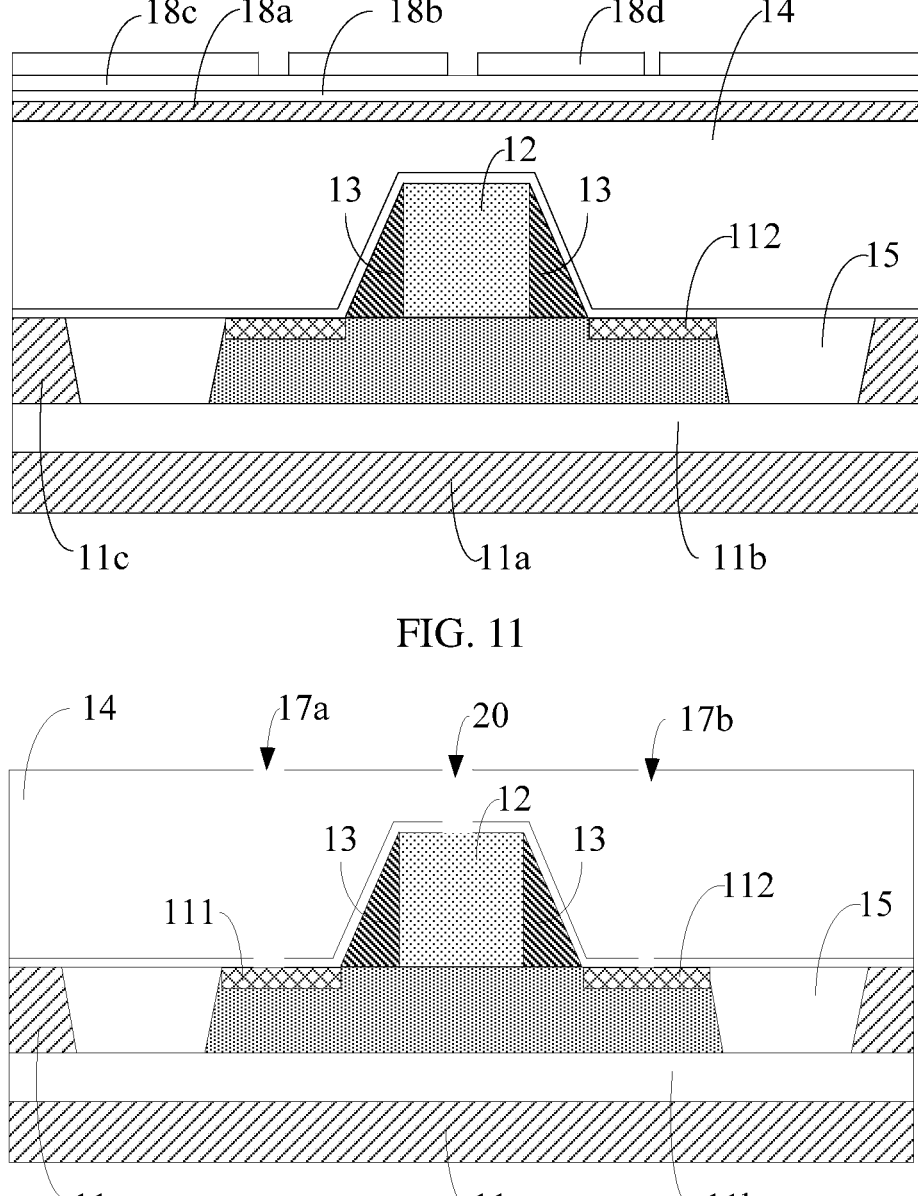
FIG. 11 is a structural schematic view of a semiconductor structure formed with a first photoresist mask in a second perspective according to an embodiment of the present disclosure.
FIG. 12 is a structural schematic view of a first connecting hole, a second connecting hole, and a first air hole defined on the semiconductor structure shown in FIG. 11.

In some embodiments, referring to FIG. 9 and FIG. 10, FIG. 9 is a structural schematic view of a semiconductor structure formed with a first photoresist mask in a first perspective according to an embodiment of the present disclosure, and FIG. 10 is a structural schematic view of a first connecting hole and a first air hole defined on the semiconductor structure shown in FIG. 9. FIG. 11 is a structural schematic view of a semiconductor structure formed with a first photoresist mask in a second perspective according to an embodiment of the present disclosure, and FIG. 12 is a structural schematic view of a first connecting hole, a second connecting hole, and a first air hole defined on the semiconductor structure shown in FIG. 11. Step S2 specifically includes: performing an etching process to form the first connecting hole 17a, the second connecting hole 20, and the first air hole 17b simultaneously in the device region.

Specifically, as shown in FIG. 9 or FIG. 11, a mask layer is formed on the semiconductor structure 1, such as depositing an amorphous carbon layer 18a, a first anti-reflective layer 18b, a second anti-reflective layer 18c, and a photoresist layer 18d in sequence, and then exposing and developing the photoresist layer 18d to form a first photoresist mask. Afterwards, as shown in FIGS. 9 to 12, the first photoresist mask is applied to dry etch at predetermined positions in the device region of the semiconductor structure 1 to form the first connecting hole 17a, the second connecting hole 20, and the first air hole 17b in the device region of the semiconductor structure 1. As shown in FIG. 12, the first connecting hole 17a runs through to the first source/drain region 111 or the second source/drain region 112 to lead the first source/drain region 111 or the second source/drain region 112 out to a surface of the interlayer dielectric layer 14 after subsequent filling of the conductive material 21 in the first connecting holes 17a. As shown in FIG. 12, the second connecting hole 20 runs through to the gate 12 to lead the gate 12 out to a surface of the interlayer dielectric layer 14 after subsequent filling of the conductive material 21 in the second connecting hole 20 for electrical connection to other metal layers. The first air hole 17b is disposed on the first source/drain region 111 or the second source/drain region 112, and further, the first air hole 17b may run through to the first source/drain region 111 or the second source/drain region 112.

Specifically, during dry etching at the predetermined positions in the device region of the semiconductor structure 1, the etching may be first performed to the etch stop layer 16; thereafter, the etching may be continued to be performed on the etch stop layer 16 until the gate 12, or until the first source/drain region 111 or the second source/drain region 112, to form the first connecting hole 17a, the second connecting hole 20, and the first air hole 17b. After forming the first connecting hole 17a, the second connecting hole 20, and the first air hole 17b, the mask layer is removed; for example, the first photoresist mask as well as the amorphous carbon layer 18a, the first anti-reflective layer 18b, and the second anti-reflective layer 18c are removed and the formed first connecting hole 17a, the second connecting hole 20, and the first air hole 17b are cleaned.

In other embodiments, in the process of dry etching at the predetermined positions in the device region of the semiconductor structure 1, the etching may be first performed to the etch stop layer 16 such that a bottom of the first connecting hole 17a and a bottom of the second connecting hole 20 are the etch stop layer 16, and a bottom of the first air hole 17b is also the etch stop layer 16; then a dielectric layer 19 is deposited on a surface of the semiconductor structure 1 to cover a first sidewall and a bottom wall of the first connecting hole 17a, and the dielectric layer 19 seals the first air hole 17b to define a first cavity. The etch stop layer 16 at the bottom of the first connecting hole 17a and the second connecting hole 20 may be removed with the subsequent etching of the dielectric layer 19.

For the reason that the first air hole 17b is formed while the first connecting hole 17a and the second connecting hole 20 are formed, there is no need to set up a dedicated process for the first air hole 17b, and the whole manufacturing process is simpler than a conventional solution with a dedicated process to prepare the first air hole 17b.

Specifically, in the same first source/drain region 111 or second source/drain region 112, a spacing between adjacent first connecting hole 17a and first air hole 17b is 0.06 to 0.08 um, which facilitates the processing of these two types of holes to be made.

The first anti-reflective layer 18b is a dielectric anti-reflective coating (DARC), and the material of the first anti-reflective layer 18b may be silicon nitride. The second anti-reflective layer 18c is a bottom anti-reflective coating (BARC), and the second anti-reflective layer 18c includes a material containing carbon and hydrogen, usually substantially a polymer. The photoresist layer 18d may be a photoresist.

When the first connecting hole 17a, the second connecting hole 20, and the first air hole 17b have a circular cross-section, the cross-sectional area of the first connecting hole 17a and/or the second connecting hole 20 is greater than the cross-sectional area of the first air hole 17b, such that during the subsequent process of sealing the first air hole 17b, the dielectric layer 19 can only deposit the sidewall and bottom wall of the first connecting hole 17a and the second connecting hole 20, while sealing the first air hole 17b. In some embodiments, the cross-sectional area of the first connecting hole 17a and/or the second connecting hole 20 is required to ensure that the conductive material 21 filled later can completely fill the first connecting hole 17a and/or the second connecting hole 20, so as to effectively ensure good electrical conductivity of the first connecting hole 17a and/or the second connecting hole 20. The above cross-section is the top surface. The top surface of the first connecting hole 17a and/or the second connecting hole 20 may be circular, oval, square, or elongated, etc. For example, when the top surface of the first connecting hole 17a and/or the second connecting hole 20 is circular, the diameter is 0.14 μm-0.18 μm and the cross-sectional area is 0.0154 um²-0.0254 um². It should be noted that the relationship between the size of the cross-section of the first connecting hole 17a and the second connecting hole 20 is not limited, as long as they are formed simultaneously by the same etching process.

The cross-sectional area of the first air hole 17b is required to ensure that the subsequently deposited dielectric layer 19 seals the first air hole 17b, but it is more difficult to completely fill into the first air hole 17b. In this way, during the subsequent deposition of the dielectric layer 19, a part of the first air hole 17b may remain a cavity, thereby reducing the parasitic capacitance between the top semiconductor layer 11c and other metal layers through this cavity of the first air hole 17b, and reducing the parasitic capacitance between the two adjacent first connecting holes 17a, thus weakening the effect of the parasitic capacitance of the resulting semiconductor device on its RF performance. The cavity means that the first air hole 17b is not filled with other substances besides air, or may be a vacuum.

Specifically, the top surface of the first air hole 17b may be circular, oval, square, or elongated, etc. The square or elongated first air hole 17b is more effective in improving the parasitic capacitance. The first air hole 17b, when made into an elongated shape, can improve the stray capacitance between the first connecting hole 17a and the gate 12.

Specifically, both the number of the first connecting holes 17a and the number of the first air holes 17b are multiple, and the first connecting holes 17a and the first air holes 17b are alternated along the X direction and/or the Y direction and are spaced apart. The first connecting holes 17a and the first air holes 17b may be distributed in a matrix. When the top surface of each first air hole 17b is circular, the diameter is 0.04-0.06 μm and the cross-sectional area is 0.0013 um² to 0.0028 um².

Figure 13:
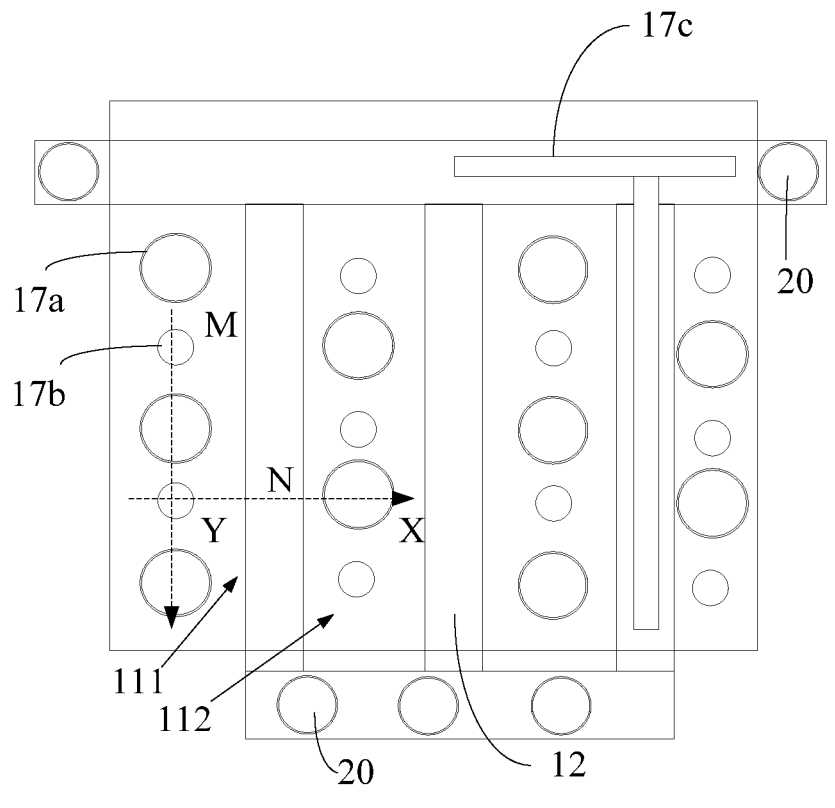
FIG. 13 is a top schematic view of a structure in which a second air hole is defined on a gate.

In a specific implementation, referring to FIG. 13, FIG. 13 is a top schematic view of a structure in which a second air hole 17c is defined on a gate 12. To further alleviate the parasitic capacitance problem, the etching process is further performed to define the second air hole 17c on the gate 12 during the formation of the first connecting hole 17a, the second connecting hole 20, and the first air hole 17b. The second air hole 17c is disposed on the gate 12. Further, the second air hole 17c may run through to the gate 12. Therefore, during the subsequent execution of step S3, a second cavity is defined in the second air hole 17c, thereby reducing the stray capacitance between the gate 12 and the nearby interconnecting through holes of the resulting semiconductor device by virtue of the second cavity. Specifically, the second air hole 17c may be made into a small hole on the gate 12 to reduce the parasitic capacitance between the source-drain interconnects, and it has a certain effect of reducing the parasitic capacitance after the size reduction without increasing the fabrication cost. The second air hole 17c may have a specific shape and size same as or similar to the first air hole 17b.

At step S3: sealing the first air hole to define a first cavity in the first air hole.

Figure 14:
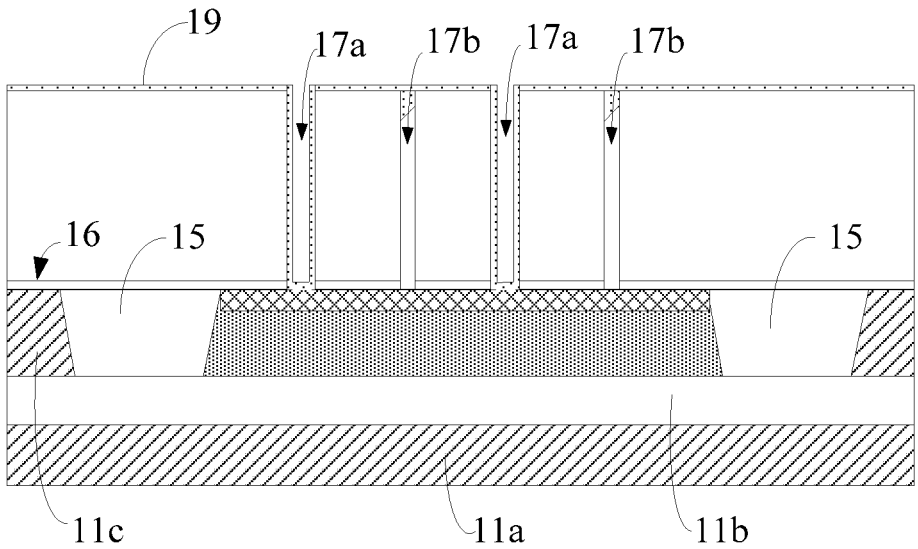
FIG. 14 is a schematic view of a structure in which a dielectric layer deposited in the first connecting hole and the first air hole shown in FIG. 10.
Figure 15:
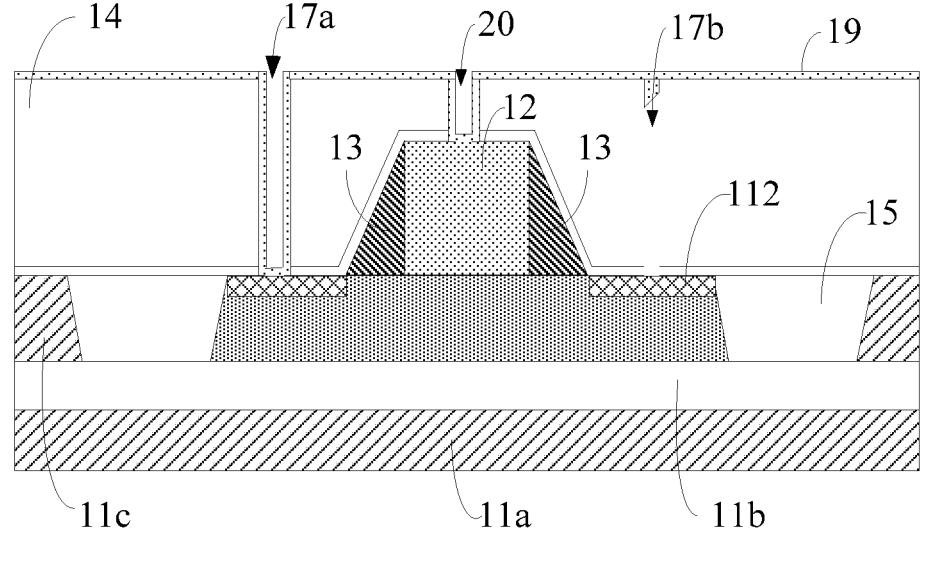
FIG. 15 is a schematic view of a structure in which a dielectric layer deposited in the first connecting hole, the second connecting hole, and the first air hole shown in FIG. 12.

Referring to FIG. 14 and FIG. 15, FIG. 14 is a schematic view of a structure in which a dielectric layer deposited in the first connecting hole and the first air hole shown in FIG. 10, and FIG. 15 is a schematic view of a structure in which a dielectric layer deposited in the first connecting hole, the second connecting hole, and the first air hole shown in FIG. 12. In order to prevent that the dielectric constant of the first air hole 17b and the second air hole 17c is affected by filling the conductive material 21 into the first air hole 17b and the second air hole 17c during the subsequent filling of the conductive material 21, the dielectric layer 19 may be deposited on the surface of the semiconductor structure 1, and the dielectric layer 19 is arranged to cover the sidewalls and bottom walls of the first connecting hole 17a and the second connecting hole 20, and the dielectric layer 19 is made to fill parts of the first air hole 17b and the second air hole 17c to seal both the first air hole 17b and the second air hole 17c, thereby defining a first cavity in the first air hole 17b and a second cavity in the second air hole 17c. In this way, the first air hole 17b and the second air hole 17c are sealed by the dielectric layer 19, which may prevent the conductive material 21 entering the first air hole 17b and the second air hole 17c during the subsequent filling of the conductive material 21, thereby ensuring that the final formed first air hole 17b and the second air hole 17c have a small dielectric constant.

Specifically, a chemical vapor deposition may be performed to form the dielectric layer 19 on the surface of the semiconductor structure 1 and inside the first air hole 17b, the first connecting hole 17a, the second connecting hole 20, and the second air hole 17c, which ensures that the dielectric layer 19 seals the first air hole 17b and the second air hole 17c, leaving a void below to form the cavities. The thickness of the dielectric layer 19 on the surface of the semiconductor structure 1 and inside the first connecting hole 17a and the second connecting hole 20 may be 0.02 um-0.03 um. The dielectric layer 19 filled at the first air hole 17b and the second air hole 17c is specifically disposed at ports of the first air hole 17b and the second air hole 17c back from the bottom semiconductor layer 11a.

Specifically, the dielectric layer 19 may be made of a material with poor filling properties, such as silicon nitride and/or silicon oxynitride, to minimize the amount of dielectric layer 19 entering the first air hole 17b and the second air hole 17c, thereby ensuring that the first air hole 17b and/or the second air hole 17c are cavities.

Of course, in other embodiments, a film layer may be arranged on a side surface of the top semiconductor layer 11c back from the buried oxide layer 11b, which seals the first air hole 17b and the second air hole 17c, while the film layer exposes the orifices of the first connecting hole 17a and the second connecting hole 20 for subsequent execution of Step S4: The film layer may be a patterned adhesive film.

At step S4: filling the first connecting hole with a conductive material.

Figure 16:
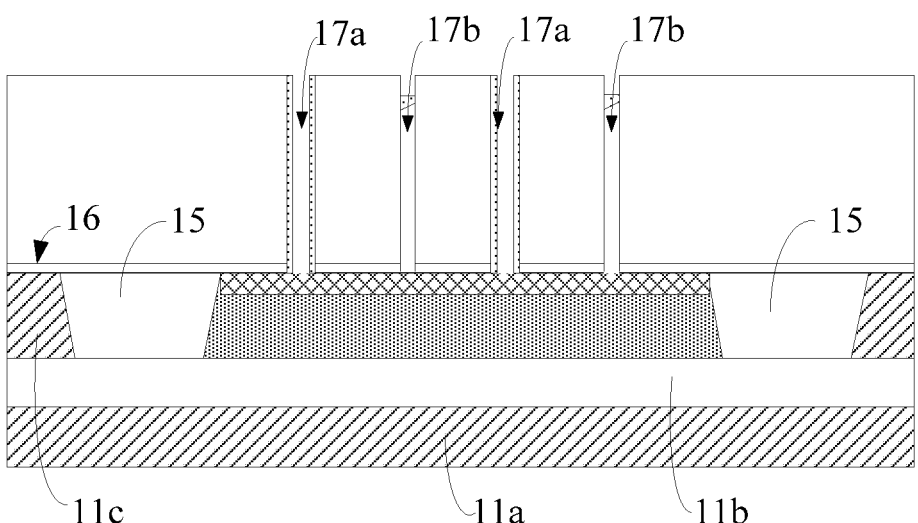
FIG. 16 is a schematic view of a structure in which the dielectric layer on a surface of the semiconductor structure and in the first connecting hole shown in FIG. 14 are removed.
Figures 17, 18:
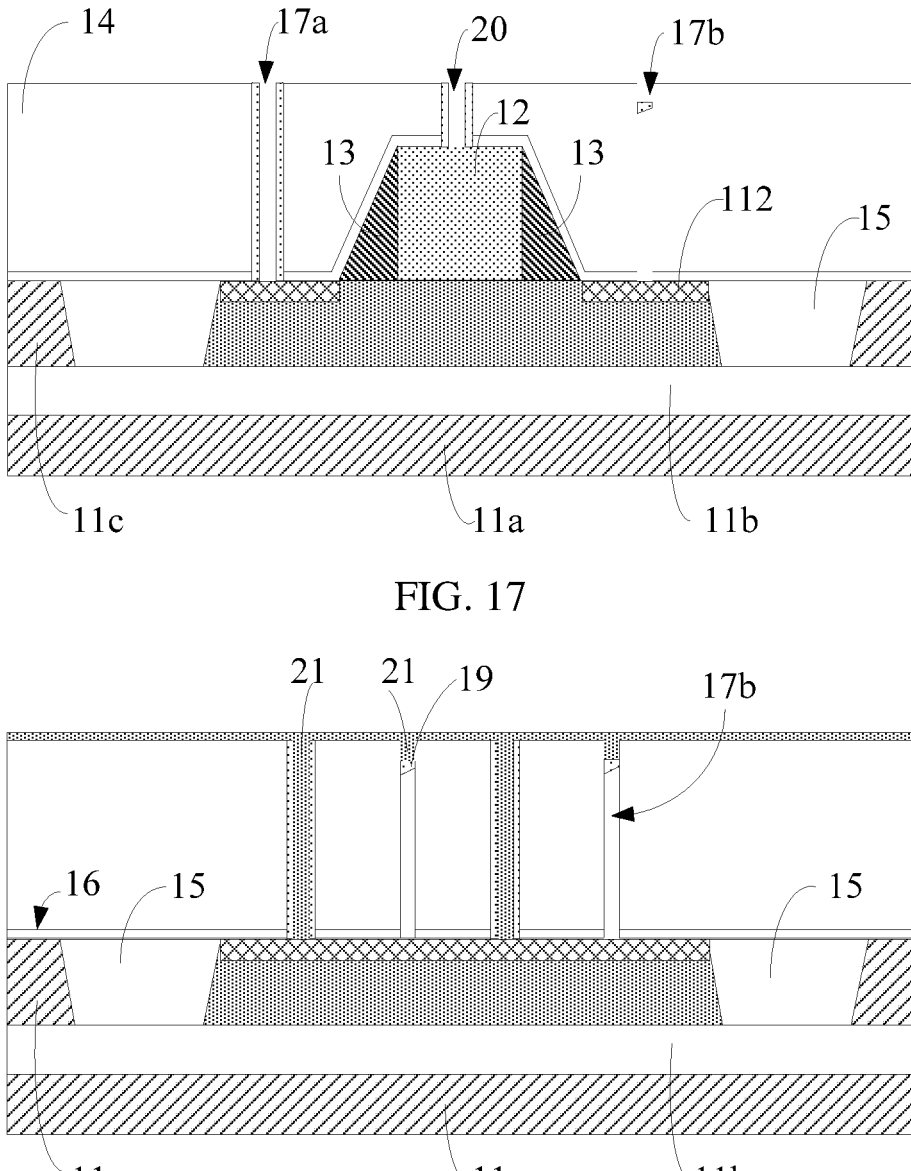
FIG. 17 is a schematic view of a structure in which the dielectric layer on a surface of the semiconductor structure and in the first connecting hole and the second connecting hole shown in FIG. 15 are removed.
FIG. 18 is a schematic view of a structure in which the first connecting hole and the second connecting hole of the structure shown in FIG. 16 are filled with a conductive material.

Referring to FIG. 16 and FIG. 17, FIG. 16 is a schematic view of a structure in which the dielectric layer 19 on the surface of the semiconductor structure 1 and in the first connecting hole 17a shown in FIG. 14 are removed, and FIG. 17 is a schematic view of a structure in which the dielectric layer 19 on the surface of the semiconductor structure 1 and in the first connecting hole 17a and the second connecting hole 20 shown in FIG. 15 are removed. To prevent the deposited dielectric layer 19 from affecting the electrical conductivity of the first connecting hole 17a and the second connecting hole 20, before step S4, the method may further include: removing at least the dielectric layer 19 on the bottom walls of the first connecting hole 17a and the second connecting hole 20 to expose the gate 12 and the first source/drain region 111 and/or the second source/drain region 112. The dielectric layer 19 on the bottom walls of the first connecting hole 17a and the second connecting hole 20 refers to the dielectric layer 19 deposited on the surface of the top semiconductor layer 11c inside the first connecting hole 17a and the second connecting hole 20. Specifically, all dielectric layers 19 within the first connecting hole 17a and the second connecting hole 20 may be removed.

In a specific implementation, dry etching may be performed to remove the dielectric layer 19 within the first connecting hole 17a and second connecting hole 20 and the dielectric layer 19 on the surface of the top semiconductor layer 11c, remaining at least a part of the dielectric layer 19 within the first air hole 17b, and remaining at least a part of the dielectric layer 19 within the second air hole 17c, to prevent subsequent deposition of the conductive material 21 into the first air hole 17b and second air hole 17c. It is understood by those skilled in the art that during etching of the dielectric layer 19 in the first connecting hole 17a and the second connecting hole 20, the dielectric layer 19 in the first air hole 17b and the second air hole 17c is also partially etched; the thickness of the unetched dielectric layer 19 in the first air hole 17b and the second air hole 17c may be 0.03 um-0.05 um.

Figures 19, 20:
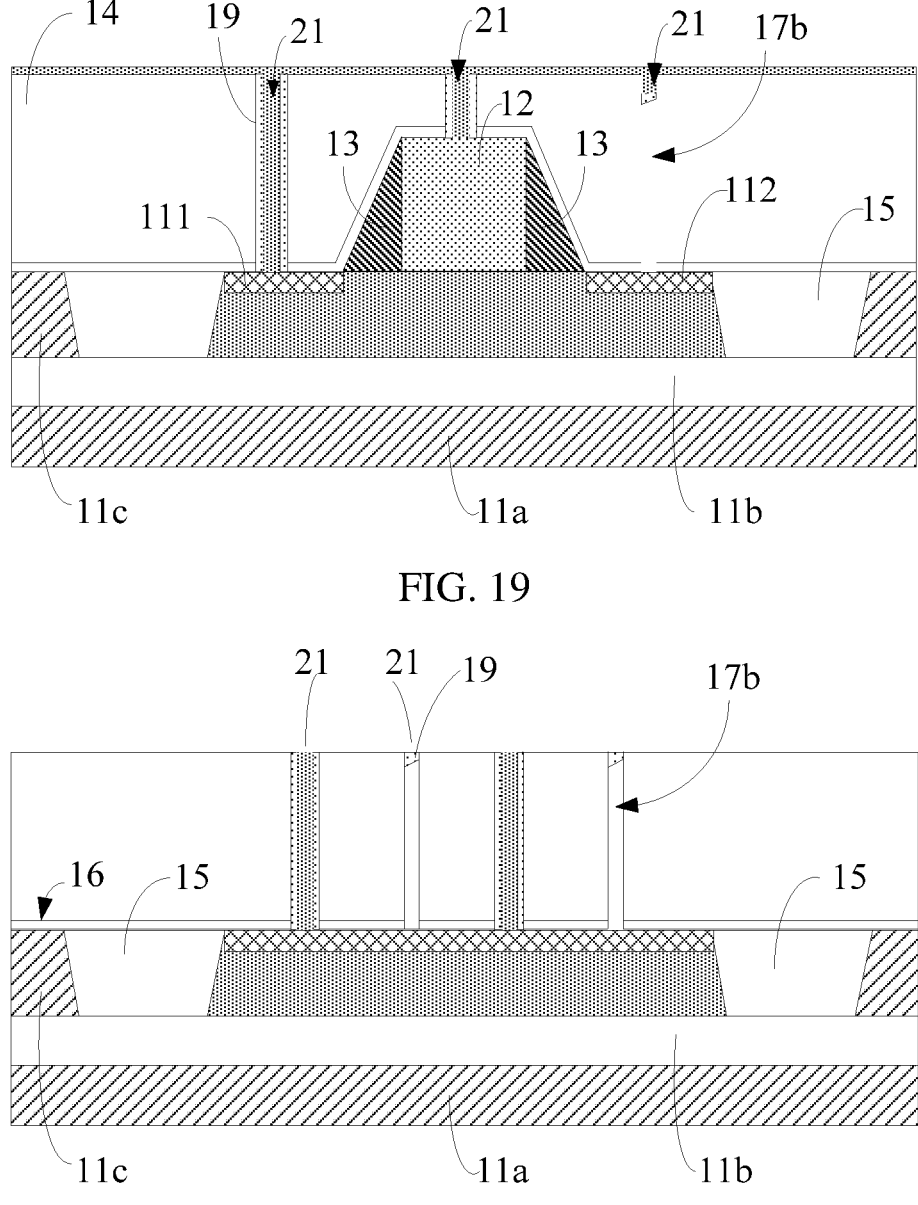
FIG. 19 is a schematic view of a structure in which the first connecting hole and the second connecting hole of the structure shown in FIG. 17 are filled with a conductive material.
FIG. 20 is a schematic view of the structure shown in FIG. 18 after being planarized.

After the removal of the dielectric layer 19, step S4 is executed, and during the execution of step S4, the conductive material 21 is specifically deposited in both the first connecting hole 17a and the second connecting hole 20. Referring to FIG. 18 and FIG. 19, FIG. 18 is a schematic view of a structure in which the first connecting hole and the second connecting hole of the structure shown in FIG. 16 are filled with a conductive material, and FIG. 19 is a schematic view of a structure in which the first connecting hole and the second connecting hole of the structure shown in FIG. 17 are filled with a conductive material. The conductive material 21 may be deposited on the surface of the semiconductor structure 1 by means of deposition, such that the conductive material 21 is filled in the first connecting hole 17a and the second connecting hole 20, thereby achieving interconnection between the gate 12, the first source/drain region 111, the second source/drain region 112 and other metal layers, i.e., device contact. The conductive material 21 may be metallic tungsten, copper, silver, etc.

Figure 21:
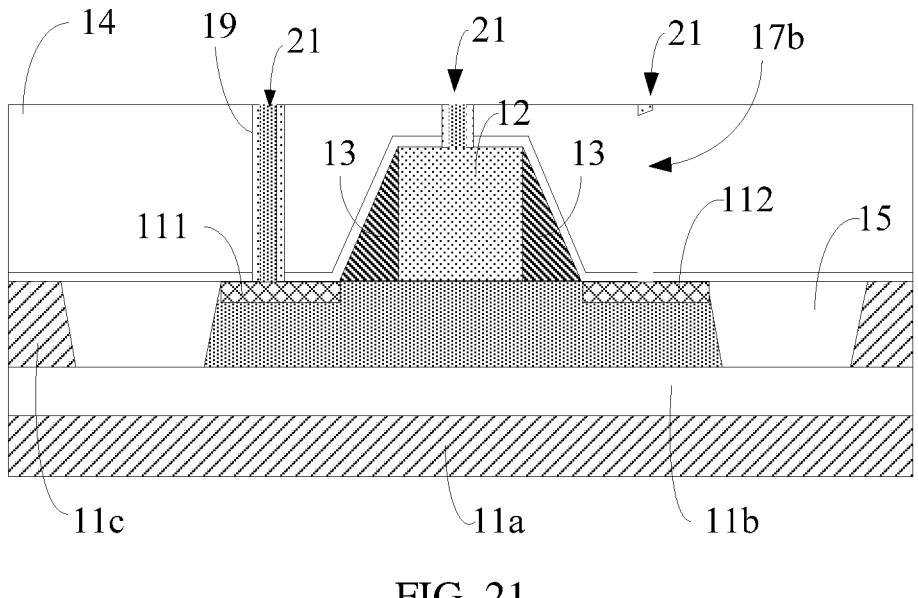
FIG. 21 is a schematic view of the structure shown in FIG. 19 after being planarized.

In a specific implementation, referring to FIG. 20 and FIG. 21, FIG. 20 is a schematic view of the structure shown in FIG. 18 after being planarized. FIG. 21 is a schematic view of the structure shown in FIG. 19 after being planarized. After step S4, the method may further include: planarizing the surface of the semiconductor structure 1. Specifically, the surface of the semiconductor structure 1 may be planarized by chemical mechanical polishing (CMP) and the conductive material 21 may be removed from the surface of the semiconductor structure 1. The conductive material 21 deposited on the top of the first air hole 17b and the second air hole 17c may be removed, and the thickness h of the dielectric layer 19 inside the first air hole 17b and/or the second air hole 17c may be 0.03 um-0.05 um.

Of course, in other embodiments, the dielectric layer 19 within the first air hole 17b and the second air hole 17c may be completely removed during the planarizing of the surface of the semiconductor structure 1 to expose the orifices of the first air hole 17b and the second air hole 17c; i.e., there is no dielectric layer 19 within the first air hole 17b and the second air hole 17c. After the dielectric layer 19 is removed, the first air hole 17b and the second air hole 17c are sealed by depositing an additional interlayer dielectric layer.

The embodiments provide a manufacturing method for semiconductor devices by forming a first connecting hole 17a and a first air hole 17b in the first source/drain region 111 and/or the second source/drain region 112 of the semiconductor structure 1, forming a second connecting hole 20 and a second air hole 17c in the gate 12, and arranging at least one first connecting hole 17a between two adjacent first air holes 17b in the X direction and/or Y direction; the X direction is the gate length direction and perpendicular to the Y direction; sealing the first air hole 17b and the second air hole 17c to define a first cavity in the first air hole 17b and a second cavity in the second air hole 17c; thereafter, filling the first connecting hole 17a and the second connecting hole 20 with the conductive material 21. The method not only enables the interconnection of the source/drain region and the gate 12 with other metal layers, but also avoids the problem of the conductive material 21 entering the first air hole 17b and the second air hole 17c. Since the dielectric constant of air is less than that of other substances, by arranging at least one first air hole 17b between two adjacent first connecting holes 17a, the at least one first air hole 17b which has the first cavity may reduce the parasitic capacitance between the two adjacent first connecting holes 17a and reduce the parasitic capacitance between the semiconductor substrate and other metal layers in the semiconductor structure 1, thereby effectively reducing the effect of the parasitic capacitance of the manufactured semiconductor device on its RF performance. In addition, by further defining a second air hole 17c to define a second cavity, the second cavity may mitigate the problem of the stray capacitance of the semiconductor device. Further, by arranging the first air hole 17b and the second air hole 17c in the device region of the semiconductor structure 1, the first air hole 17b and the second air hole 17c may be formed at the same time as the first connecting hole 17a and the second connecting hole 20, eliminating the need to set up a processing process specifically for the first air hole 17b and the second air hole 17c. Compared with the solution of preparing the first air hole 17b and the second air hole 17c by a special process, the whole manufacturing process of the semiconductor device is simpler.

In conjunction with FIG. 13, FIG. 18 and FIG. 19, in some embodiments, a semiconductor device is further provided. The semiconductor device is produced by the manufacturing method for the semiconductor device described above. The semiconductor device has a lower parasitic capacitance and better RF performance.

The semiconductor structure 1 includes a semiconductor substrate, a gate 12 disposed on the semiconductor substrate, a sidewall 13, and an interlayer dielectric layer 14 covering the semiconductor substrate, the gate 12, and the sidewall 13. The semiconductor structure 1 includes a first source/drain region 111 and a second source/drain region 112. The semiconductor substrate may be a silicon substrate, a germanium substrate, a semiconductor on insulator (SOI) substrate, etc. In the following embodiments, the RF device formed on the SOI substrate is taken as an example, the SOI substrate is silicon-on-insulator or germanium-on-insulator, and the semiconductor substrate includes a bottom semiconductor layer 11a, a buried oxide layer 11b, and a top semiconductor layer 11c, which are sequentially laminated.

The first source/drain region 111 and the second source/drain region 112 are specifically formed in the top semiconductor layer 11c. The first source/drain region 111 and the second source/drain region 112 may be in contact with the buried oxide layer 11b; or may not be in contact with the buried oxide layer 11b and be disposed above the buried oxide layer 11b, as shown in FIG. 3 or FIG. 4. Multiple isolation structures 15 are formed on the top semiconductor layer 11c, to divide the top semiconductor layer 11c into multiple device regions, each device region corresponding to at least one first source/drain region 111 and at least one second source/drain region 112. Specifically, the top semiconductor layer 11c and the bottom semiconductor layer 11a may be silicon, and the buried oxygen layer 11b may be silicon oxide or silicon nitride.

Specifically, the first connecting hole 17a and the first air hole 17b are disposed on the first source/drain region 111 and/or the second source/drain region 112. The first connecting hole 17a runs through to the first source/drain region 111 or the second source/drain region 112; the first connecting hole 17a is filled with a conductive material 21, and the conductive material 21 contacts the first source/drain region 111 and/or the second source/drain region 112 to achieve an electrical connection between the first source/drain region 111 and/or the second source/drain region 112 and the other metal layers. The first air hole 17b is disposed on the first source/drain region 111 or the second source/drain region 112; a first cavity is defined in the first air hole 17b. Since the dielectric constant of air or vacuum is less than that of other substances, the parasitic capacitance between the semiconductor substrate and other metal layers may be reduced by defining the first cavity in the first air hole 17b, thereby effectively attenuating the effect of the parasitic capacitance of the fabricated semiconductor device on its RF performance.

Specifically, as shown in conjunction with FIGS. 5, 6, 7, 13 and 18, at least one first air hole 17b is arranged between two adjacent first connecting holes 17a in the X direction and/or Y direction, to reduce the parasitic capacitance between two adjacent first connecting holes 17a using the cavity structure defined by the first air hole 17b. Specifically, one first air hole 17b may be arranged between two adjacent first connecting holes 17a in the X direction and/or Y direction to avoid short circuit problems between two adjacent first connecting holes 17a, while reducing parasitic capacitance. Alternatively, as shown in FIGS. 6 and 7, two first air holes 17b may be arranged between two adjacent first connecting holes 17a in the X direction and/or Y direction to minimize parasitic capacitance while ensuring that no short-circuit problem occurs between the two adjacent first connecting holes 17a.

In some embodiments, as shown in FIG. 5, one first connecting hole 17a or one first air hole 17b may be arranged in each source/drain region 111/112. In this way, the area of each source/drain region 111/112 may be controlled without increasing the width W of each source/drain region 111/112 on the basis of reducing the parasitic capacitance between the two adjacent first connecting holes 17a.

Of course, as shown in FIG. 8b, one first connecting hole 17a and one first air hole 17b may be arranged in each source/drain region 111/112 in the X direction.

In some embodiments, as shown in FIG. 12, a second connecting hole 20 is further defined on the gate 12, which runs through to the gate 12, and the conductive material 21 in the second connecting hole 20 contacts the gate 12 to lead the gate 12 out of a surface of the interlayer dielectric layer 14, to be electrically connected to other metal layers.

Further, a second air hole 17c is defined on the gate 12, and a second cavity is defined in the second air hole 17c.

Specifically, as shown in FIG. 20 or FIG. 21, ports of the first air hole 17b and the second air hole 17c back from the top semiconductor layer 11c are filled with a dielectric layer 19, and the dielectric layer 19 seals the first air hole 17b and the second air hole 17c to define a first cavity in the first air hole 17b and a second cavity in the second air hole 17c. Defining the first cavity in the first air hole 17b may reduce the parasitic capacitance between the top semiconductor layer 11c and other interconnecting metal layers, and between two adjacent first connecting holes 17a. Arranging the second air hole 17c to define the second cavity may mitigate the problem of the stray capacitance of the semiconductor device, thereby attenuating the effect of the parasitic capacitance of the semiconductor device on its RF performance and improving the quality factor of the semiconductor device.

Specifically, as shown in FIG. 19 or FIG. 20, the first air hole 17b and the second air hole 17c may be filled with the conductive material 21, the conductive material 21 is disposed on the surface of a side surface of the dielectric layer 19 back from the top semiconductor layer 11c, and a side surface of the conductive material 21 back from the dielectric layer 19 is flush with the side surface of the interlayer dielectric layer 14 back from the top semiconductor layer 11c.

The conductive material 21 may be metallic tungsten, copper, silver, and the like. The thickness of the dielectric layer 19 may be 0.03 um-0.05 um. The dielectric layer 19 may be silicon nitride and/or silicon oxynitride.

When the cross-section of the first connecting hole 17a, the second connecting hole 20 and the first air hole 17b are all circular, the cross-sectional area of the first connecting hole 17a and/or the second connecting hole 20 is greater than the cross-sectional area of the first air hole 17b and the second air hole 17c. The top surface of each of the first connecting hole 17a may be circular, elliptical, square, or elongated, etc. For example, when the top surface of the first connecting hole 17a is circular, its cross-sectional area is 0.0154 $um^2$ to 0.0254 $um^2$.

The top surface of the first air hole 17b and/or the second air hole 17c may be circular, elliptical, square, or elongated, etc. Specifically, the number of the first air holes 17b is plural, and the first air holes 17b are spaced apart and distributed in a single row. Alternatively, the first air holes 17b are distributed in a matrix. For example, when the top surface of the first air hole 17b is circular, the cross-sectional area of the first air hole 17b is 0.0013 $um^2$ to 0.0028 $um^2$.

The semiconductor structure 1 may further include an etch stop layer 16, which is laminated on a side of the top semiconductor layer 11c back from the bottom semiconductor layer 11a and wraps around a side of the gate 12 and the sidewall 13 back from the top semiconductor layer 11c, to define etch stop positions during the subsequent formation of the first connecting hole 17a, the second connecting hole 20, the first air hole 17b, and the second air hole 17c. The etch stop layer 16 may be silicon nitride or silicon oxynitride.

The embodiments of the present disclosure provide a semiconductor device in which a first air hole 17b is arranged in the first source/drain region 111 and/or the second source/drain region 112 of the semiconductor structure 1 and a first cavity is defined in the first air hole 17b, which effectively reduces the parasitic capacitance between the semiconductor substrate and other interconnecting metal layers due to the less dielectric constant of air compared to that of other substances, thereby effectively reducing the parasitic capacitance of the semiconductor device. In addition, by arranging at least one first air hole 17b between two adjacent first connecting holes 17a, the parasitic capacitance between the two adjacent first connecting holes 17a is reduced by the first cavity defined by the first air hole 17b. In addition, by further arranging a second air hole 17c to define a second cavity, the second cavity may mitigate the problem of the stray capacitance of the semiconductor device. Further, by arranging the first air hole 17b and/or the second air hole 17c on the first source/drain region 111, the second source/drain region 112, and the gate 12 of the semiconductor substrate, the first air hole 17b and/or the second air hole 17c may be formed at the same time as the first connecting hole 17a and the second connecting hole 20, eliminating the need to set up a processing process specifically for the first air hole 17b and the second air hole 17c. Compared with the solution of preparing the first air hole 17b and the second air hole 17c by a special process, the whole manufacturing process of the semiconductor device is simpler.

The above is only an implementation of the present disclosure, not to limit the scope of the present disclosure. Any equivalent structure or equivalent process transformation made by using the specification and the attached drawings of the present disclosure, or directly or indirectly applied in other related technical fields, are included in the scope of the present disclosure.

What is claimed is:

1. A semiconductor device, comprising:
   a semiconductor structure, comprising: a semiconductor substrate, a gate disposed on the semiconductor substrate, and an interlayer dielectric layer covering the semiconductor substrate and the gate; wherein the semiconductor structure further comprises a first source/drain region and a second source/drain region, and the first source/drain region and the second source/drain region are adjacent to each other in an X direction, the X direction being a gate length direction; the first source/drain region is one of a source region and a drain region, and the second source/drain region is the other one of the source region and the drain region;
   wherein a plurality of first connecting holes are on defined at least one of the first source/drain region and the second source/drain region, and at least one first air hole is defined on at least one of the first source/drain region and the second source/drain region; each first connecting hole is filled with a conductive material, and the conductive material is in contact with the first source/drain region or the second source/drain region where the first connecting hole is located; a first cavity is defined in each of the at least one first air hole; at least one of the at least one first air hole is arranged between each adjacent two of the plurality of first connecting holes in at least one of the X direction and a Y direction, the Y direction being perpendicular to the X direction and parallel to a surface of the semiconductor substrate.

2. The semiconductor device according to claim 1, wherein in the X direction, in a row, the first source/drain region is only arranged with one of the plurality of first connecting holes, and the second source/drain region is only arranged with one of the at least one first air hole;

in another row adjacent to the row, the first source/drain region is only arranged with one of the at least one first air hole, and the second source/drain region is only arranged with one of the plurality of first connecting holes.

3. The semiconductor device according to claim 1, wherein in the X direction, in a row, the first source/drain region is only arranged with one of the plurality of first connecting holes, and the second source/drain region is only arranged with at least two of the at least one first air hole; in another row adjacent to the row in the Y direction, the first source/drain region is only arranged with at least two of the at least one first air hole, and the second source/drain region is only arranged with one of the plurality of first connecting holes; and/or in the Y direction, for each of the first source/drain region and the second source/drain region, at least two of the at least one first air hole is arranged between each adjacent two of the plurality of first connecting holes.

4. The semiconductor device according to claim 1, wherein the first source/drain region is arranged with only one of the at least one first air hole; the one of the at least one first air hole has an elongated top view and extends along the Y direction; each first connecting hole arranged in the Y direction on the first source/drain region has a positive projection along the X direction falling at least partially on the one of the at least one first air hole.

5. The semiconductor device according to claim 1, wherein the first source/drain region is arranged with only a plurality of the at least one first air hole; the plurality of the at least one first air hole each has an elongated top view and extends along the Y direction; each first connecting hole arranged in the Y direction on the first source/drain region has a positive projection along the X direction falling at least partially on a corresponding first air hole.

6. The semiconductor device according to claim 1, wherein a second connecting hole is defined on the gate, the conductive material is further filled in the second connecting hole, and the conductive material is in contact with the gate.

7. The semiconductor device according to claim 1, wherein a second air hole is defined on the gate, and a second cavity is defined in the second air hole.

8. The semiconductor device according to claim 1, wherein the number of the at least one first air hole is greater than one, and the plurality of first connecting holes and the at least one first air hole are alternated along at least one of the X direction and the Y direction.

9. The semiconductor device according to claim 7, wherein a dielectric layer is arranged at an orifice of each first connecting hole to seal each first connecting hole and an orifice of the second connecting hole to seal the second connecting hole; the dielectric layer comprises at least one of silicon nitride and silicon oxynitride.

10. The semiconductor device according to claim 1, wherein the first air hole or the second air hole has a circular, square, oval or elongated cross-section in a top surface view.

11. The semiconductor device according to claim 1, wherein the semiconductor substrate comprises a bottom semiconductor layer, a buried oxide layer, and a top semiconductor layer, which are sequentially laminated;

the semiconductor structure further comprises a sidewall, the interlayer dielectric layer covering the semiconductor substrate, the gate, and the sidewall; wherein the sidewall is disposed on both sides of the gate; the gate, the sidewall, and the interlayer dielectric layer are specifically arranged on a side of the top semiconductor layer back from the buried oxide layer.

12. The semiconductor device according to claim 11, wherein the semiconductor structure further comprises an etch stop layer; the etch stop layer is laminated on a side of the top semiconductor layer back from the bottom semiconductor layer and wraps around the gate and sides of the sidewall back from the top semiconductor layer.

13. A manufacturing method, for manufacturing the semiconductor device according to claim 1, comprising:

providing a semiconductor structure, the semiconductor structure comprising a semiconductor substrate, a gate disposed on the semiconductor substrate, and an interlayer dielectric layer covering the semiconductor substrate and the gate; wherein the semiconductor structure further comprises a first source/drain region and a second source/drain region, and the first source/drain region and the second source/drain region are adjacent to each other in an X direction, the X direction being a gate length direction; the first source/drain region is one of a source region and a drain region, and the second source/drain region is the other one of the source region and the drain region;

defining a plurality of first connecting holes and at least one first air hole on at least one of the first source/drain region and the second source/drain region; wherein at least one of the at least one first air hole is arranged between each adjacent two of the plurality of first connecting holes in at least one of the X direction and a Y direction, the Y direction being perpendicular to the X direction and parallel to a top surface of the semiconductor substrate;

sealing each first air hole to define a first cavity in the first air hole; and filling each first connecting hole with a conductive material.

14. The manufacturing method according to claim 13, wherein the defining a plurality of first connecting holes and at least one first air hole on at least one of the first source/drain region and the second source/drain region comprises:

performing an etching process to simultaneously define the plurality of first connecting holes and the at least one first air hole; wherein in each row in the X direction, one of the first source/drain region and the second source/drain region is only arranged with one of the plurality of first connecting holes, and the other one of the first source/drain region and second source/drain region is only arranged with one of the at least one first air hole.

15. The manufacturing method according to claim 13, wherein the defining a plurality of first connecting holes on at least one of the first source/drain region and the second source/drain region, and defining at least one first air hole on at least one of the first source/drain region and the second source/drain region comprises:

performing an etching process to simultaneously define the plurality of first connecting holes, a second connecting hole, and the at least one first air hole in a device region, the device region corresponding to the first source/drain region, the second source/drain region, and the gate;

wherein each first connecting hole runs through to the first source/drain region or the second source/drain region where the first connecting hole is located; the second connecting hole runs through to the gate; the conductive material is filled into each first connecting hole and the second connecting hole; each first air hole is disposed on the first source/drain region or the second source/drain region where the first air hole is located.

16. The manufacturing method according to claim 15, further comprising:

defining simultaneously a second air hole in the device region by performing the etching process; wherein the second air hole is disposed on the gate;

wherein the sealing each first air hole to define a first cavity in the first air hole comprises:

simultaneously sealing the second air hole to define a second cavity.

17. The manufacturing method according to claim 13, wherein the number of the at least one first air hole is greater than one, and the plurality of first connecting holes and the at least one first air hole are alternated along at least one of the X direction and the Y direction.

18. The manufacturing method according to claim 13, wherein the sealing each first air hole to define a first cavity in the first air hole comprises:

depositing a dielectric layer on a surface of the semiconductor structure to cover a sidewall and a bottom wall of each first connecting hole and to seal the first air hole to define the first cavity.

19. The manufacturing method according to claim 18, before the filling each first connecting hole with a conductive material, further comprising:

removing at least the dielectric layer on the bottom wall of each first connecting hole to expose the first source/drain region and/or the second source/drain region, and remaining at least part of the dielectric layer in the first air hole.

20. The manufacturing method according to claim 16, wherein the first air hole or the second air hole has a circular, square, oval or elongated cross-section in a top surface view.

* * * * *